United States Patent
Youssef et al.

(10) Patent No.: US 9,106,185 B2
(45) Date of Patent: Aug. 11, 2015

(54) AMPLIFIERS WITH INDUCTIVE DEGENERATION AND CONFIGURABLE GAIN AND INPUT MATCHING

(71) Applicant: QUALCOMM Incorporated, San Diego, CA (US)

(72) Inventors: Ahmed A Youssef, San Diego, CA (US); Sherif Abdelhalem, San Diego, CA (US); Ehab A Abdel Ghany, San Diego, CA (US); Li-Chung Chang, Irvine, CA (US)

(73) Assignee: Qualcomm Incorporated, San Diego, CA (US)

( * ) Notice: Subject to any disclaimer, the term of this patent is extended or adjusted under 35 U.S.C. 154(b) by 92 days.

(21) Appl. No.: 13/794,110

(22) Filed: Mar. 11, 2013

(65) Prior Publication Data

US 2014/0253242 A1    Sep. 11, 2014

(51) Int. Cl.
| | |
|---|---|
| *H03G 3/12* | (2006.01) |
| *H03F 1/22* | (2006.01) |
| *H03F 1/08* | (2006.01) |
| *H03F 1/56* | (2006.01) |
| *H03F 3/189* | (2006.01) |

(Continued)

(52) U.S. Cl.
CPC ............... *H03F 1/223* (2013.01); *H03F 1/08* (2013.01); *H03F 1/56* (2013.01); *H03F 3/189* (2013.01); *H03F 3/45179* (2013.01); *H03G 1/0023* (2013.01); *H03F 2200/492* (2013.01)

(58) Field of Classification Search
CPC ............... H03G 3/12; H03G 3/30; H03F 1/22
USPC ........................................... 330/283, 302, 278
See application file for complete search history.

(56) References Cited

U.S. PATENT DOCUMENTS

| | | | |
|---|---|---|---|
| 6,933,779 B2 * | 8/2005 | Lee et al. ..................... | 330/51 |
| 7,612,610 B2 | 11/2009 | Chen | |
| 7,902,925 B2 | 3/2011 | Kim et al. | |

(Continued)

FOREIGN PATENT DOCUMENTS

| | | |
|---|---|---|
| EP | 1931027 A1 | 6/2008 |
| JP | H04257104 A | 9/1992 |
| WO | 0215397 A2 | 2/2002 |

OTHER PUBLICATIONS

International Search Report and Written Opinion—PCT/US2014/020994—ISA/EPO—May 22, 2014.

*Primary Examiner* — Henry Choe
(74) *Attorney, Agent, or Firm* — Smith Risley Tempel Santos LLC

(57) ABSTRACT

Amplifiers with inductive degeneration and configurable gain and input matching are disclosed. In an exemplary design, an apparatus includes a gain transistor, an inductor, and an input matching circuit for an amplifier. The gain transistor has a variable gain determined based on its bias current. The inductor is coupled between the gain transistor and circuit ground. The input matching circuit is selectively coupled to the gain transistor based on the variable gain of the gain transistor. For example, the input matching circuit may be coupled to the gain transistor in a low-gain mode and decoupled from the gain transistor in the high-gain mode. In an exemplary design, the input matching circuit includes a resistor, a capacitor, and a second transistor coupled in series. The resistor is used for input matching of the amplifier. The second transistor couples or decouples the resistor to or from the gain transistor.

17 Claims, 10 Drawing Sheets

(51) Int. Cl.
  *H03F 3/45* (2006.01)
  *H03G 1/00* (2006.01)

(56) References Cited

U.S. PATENT DOCUMENTS 8,149,050 B2 * 4/2012 Cabanillas ................ 330/51
8,175,566 B2   5/2012 Tasic et al.
8,229,367 B2   7/2012 Chan et al.
8,704,600 B2 * 4/2014 Sasaki ...................... 330/302
2002/0030545 A1 * 3/2002 Hashemi et al. ........... 330/302
2002/0070809 A1 * 6/2002 Watanabe et al. .......... 330/302
2004/0056712 A1   3/2004 Lee et al.
2011/0070848 A1   3/2011 Ramachandra

* cited by examiner

AMPLIFIERS WITH INDUCTIVE DEGENERATION AND CONFIGURABLE GAIN AND INPUT MATCHING

BACKGROUND

I. Field

The present disclosure relates generally to electronics, and more specifically to amplifiers.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a local oscillator (LO) signal with data to obtain a modulated signal, amplify the modulated signal to obtain an output radio frequency (RF) signal having the proper transmit power level, and transmit the output RF signal via an antenna to a base station. For data reception, the receiver may obtain a received RF signal via the antenna and may amplify and process the received RF signal to recover data sent by the base station.

A wireless device may include amplifiers of different types for different purposes. For example, a wireless device may include a low noise amplifier (LNA) in a receiver, a power amplifier (PA) in a transmitter, and a variable gain amplifier (VGA) in the receiver and/or the transmitter. An amplifier (e.g., an LNA) may be required to have a configurable gain in order to handle different signal conditions. It may be desirable to provide configurable gain while achieving good performance and low power consumption for the amplifier.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Amplifiers with inductive degeneration and configurable gain and input matching are disclosed herein. These amplifiers can provide configurable gain while achieving good performance and low power consumption. These amplifiers may be used for various electronic devices such as wireless communication devices.

Figure 1:
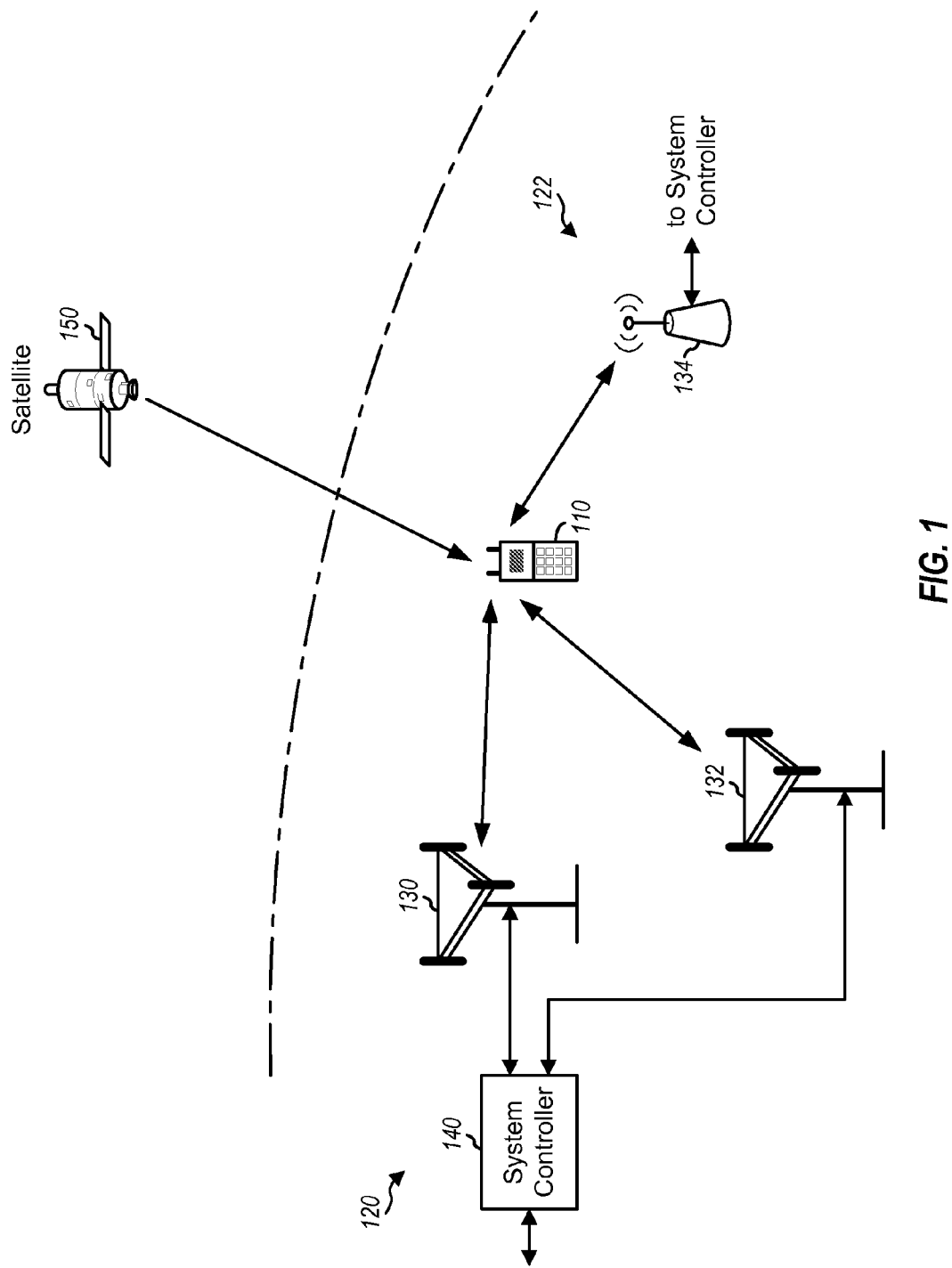
FIG. 1 shows a wireless device communicating with wireless systems.

FIG. 1 shows a wireless device 110 communicating with wireless communication systems 120 and 122. Each wireless system may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous CDMA (TD-SCDMA), or some other version of CDMA. For simplicity, FIG. 1 shows wireless system 120 including two base stations 130 and 132 and one system controller 140, and wireless system 122 including one base station 134. In general, a wireless system may include any number of base stations and any set of network entities. A base station may also be referred to as a Node B, an evolved Node B (eNB), an access point, etc.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120 and/or 122. Wireless device 110 may also receive signals from broadcast stations, signals from satellites (e.g., a satellite 150) in one or more global navigation satellite systems (GNSS), etc. Wireless device 110 may support one or more radio technologies for wireless communication such as LTE, WCDMA, CDMA 1X, TD-SCDMA, GSM, 802.11, etc.

Figure 2:
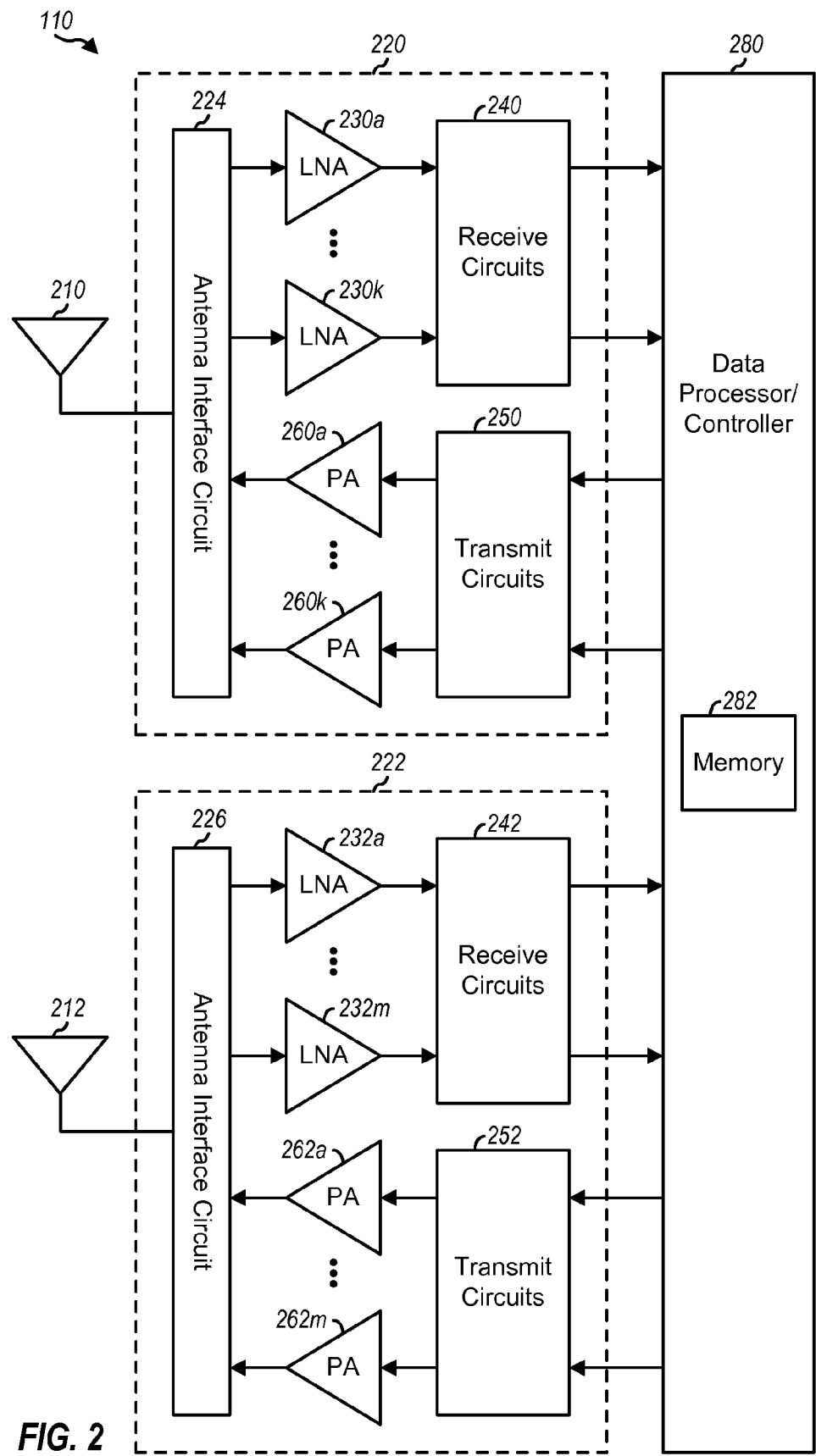
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes an antenna interface circuit 224, multiple (K) LNAs 230a to 230k, receive circuits 240, transmit circuits 250, and multiple (K) power amplifiers (PAs) 260a to 260k. Transceiver 222 includes an antenna interface circuit 226, multiple (M) LNAs 232a to 232m, receive circuits 242, transmit circuits 252, and multiple (M) PAs 262a to 262m. Transceivers 220 and 222 may support multiple frequency bands, carrier aggregation, multiple radio technologies, multiple wireless systems, receive diversity, transmit diversity, MIMO transmission from multiple transmit antennas to multiple receive antennas, etc., or any combination thereof.

For data reception, antenna 210 receives signals from base stations and/or other transmitter stations and provides a received RF signal to antenna interface circuit 224. Antenna interface circuit 224 provides one or more input RF signals to one or more selected LNAs 230. Antenna interface circuit 224 may include switches, duplexers, diplexers, transmit filters, receive filters, matching circuits, directional couplers, etc. Each selected LNA 230 amplifies its input RF signal and provides one or more amplified RF signals to receive circuits 240. Receive circuits 240 downconvert each amplified RF signal from RF to baseband, filter and amplify the downconverted signal, and provide an input baseband signal to data processor 280. Receive circuits 240 may include mixers, filters, amplifiers, matching circuits, oscillators, LO generators, phase locked loops (PLLs), etc.

For data transmission, data processor 280 processes (e.g., encodes and modulates) data to be transmitted and provides one or more output baseband signals to transmit circuits 250. Transmit circuits 250 amplify, filter, and upconvert each output baseband signal from baseband to RF and provide a modulated signal to a selected PA 260. Transmit circuits 250 may include amplifiers, filters, mixers, matching circuits, oscillators, LO generators, PLLs, etc. Each selected PA 260 amplifies its modulated signal and provides an output RF signal having the proper transmit power level. The output RF signal from each selected PA 260 is routed through antenna interface circuit 224 and transmitted via antenna 210.

LNAs 232, receive circuits 242, transmit circuits 252, and PAs 262 within transceiver 222 may operate in similar manner as LNAs 230, receive circuits 240, transmit circuits 250, and PAs 260 within transceiver 220. Transceivers 220 and 222 may include other circuits not shown in FIG. 2. All or a portion of transceivers 220 and 222 may be implemented on one or more analog integrated circuits (ICs), RF ICs (RFICs), mixed-signal ICs, etc. For example, LNAs 230 and receive circuits 240 may be implemented on one module, which may be an RFIC, etc. The circuits in transceivers 220 and 222 may also be implemented in other manners.

Data processor/controller 280 may perform various functions for wireless device 110. For example, data processor 280 may perform processing for data being received via receiver circuits 240 and 242 and data being transmitted via transmit circuits 250 and 252. Controller 280 may control the operation of various circuits within transceivers 220 and 222. A memory 282 may store program codes and data for data processor/controller 280. Data processor/controller 280 may be implemented on one or more application specific integrated circuits (ASICs) and/or other ICs.

FIG. 2 shows an exemplary design of wireless device 110 with two transceivers 220 and 222 coupled to two antennas 210 and 212. In general, a wireless device may include any number of transceivers for any number of antennas. Each transceiver may include any number of LNAs and any number of PAs to support any number of frequency bands, any number of wireless systems, any number of radio technologies, etc.

LNAs 230 and 232 in FIG. 2 may have configurable gain in order to handle a range of signal conditions. An LNA with configurable gain may be implemented in various manners and with transistors of various types. Some exemplary circuit designs of LNAs implemented with N-channel metal oxide semiconductor (NMOS) transistors are described below.

Figure 3:
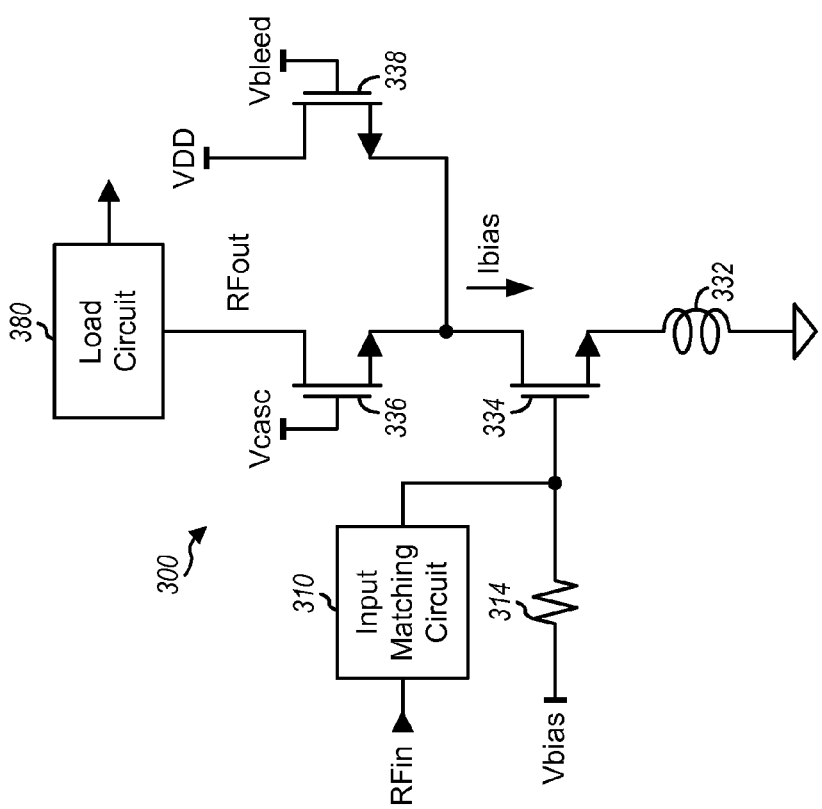
FIG. 3 shows a schematic diagram of an LNA with inductive degeneration and configurable gain.

FIG. 3 shows a schematic diagram of an LNA 300 with inductive degeneration and configurable gain. LNA 300 includes a source degeneration inductor 332, a gain transistor 334, and two cascode transistors 336 and 338. An input matching circuit 310 has one end receiving an input RF signal (RFin) and the other end coupled to the gate of gain transistor 334. Gain transistor 334 has its source coupled to one end of inductor 332 and its drain coupled to the sources of cascode transistors 336 and 338. The other end of inductor 332 is coupled to circuit ground. Cascode transistor 336 has its gate receiving a first control signal (Vcasc) and its drain coupled to a load circuit 380. Cascode transistor 338 has its gate receiving a second control signal (Vbleed) and its drain coupled to a power supply voltage (VDD). Gain transistor 334 and cascode transistors 336 and 338 may be implemented with NMOS transistors, as shown in FIG. 3, or with transistors of other types. A resistor 314 has one end coupled to the gate of gain transistor 334 and the other end receiving a bias voltage (Vbias) for gain transistor 334.

Within LNA 300, gain transistor 334 amplifies the RFin signal and provides an amplified signal. When enabled, cascode transistor 336 buffers the amplified signal and provides an output RF signal (RFout) to load circuit 380. When enabled, cascode transistor 338 conducts some of the current flowing through gain transistor 334, which would then result in less current flowing through cascode transistor 336. Source degeneration inductor 332 performs several functions. First, inductor 332 enables LNA 300 to obtain good dynamic range (e.g., good noise figure) and achieve high sensitivity for a receiver with low power consumption. Second, inductor 332 helps with input matching of LNA 300.

Gain transistor 334 may be biased with a bias current of Ibias, which may be determined by the Vbias voltage applied to the gate of gain transistor 334 via resistor 314. The bias current may be selected to obtain a desired gain and dynamic range for LNA 300. The bias voltage may be adjusted such that a desired amount of bias current flows through gain transistor 334. Higher gain may be obtained for LNA 300 with higher bias current, and vice versa.

The input RF signal provided to LNA 300 may include one or more desired signals as well as interfering signals. A desired signal is a transmitted signal to be received by a wireless device. An interfering signal is a transmitted signal not being received by the wireless device. The input RF signal may include a jammer, which is an interfering signal having a much larger amplitude than that of a desired signal and located close in frequency to the desired signal. Non-linearity of LNA 300 may result in the jammer causing intermodulation distortion (IMD). The IMD may overlap a desired signal in frequency and may act as additional noise that may adversely impact reception of the desired signal.

LNA 300 may support multiple gain modes in order to handle different signal conditions. The multiple gain modes may include a high-gain mode and a low-gain mode. LNA 300 may operate in the high-gain mode and provide a desired high gain when jammers are not present in the input RF signal. LNA 300 may operate in a low-gain mode and provide a lower gain when a jammer is present in the input RF signal. LNA 300 may have a lower gain in the low-gain mode than in the high-gain mode. For example, the low-gain mode may be associated with a gain of 6 to 9 decibels (dB) lower than a gain associated with the high-gain mode. The lower gain in the low-gain mode may help a receiver meet linearity requirements in the presence of a jammer.

In the high-gain mode, cascode transistor 336 may be turned ON and cascode transistor 338 may be turned OFF. Cascode transistor 336 may conduct all of the current flowing through gain transistor 334. Gain transistor 334 may be biased with a sufficient amount of bias current to obtain the desired gain, linearity, and dynamic range for LNA 300 in the high-gain mode.

In the low-gain mode, bias current reduction and/or current bleeding may be used to obtain a lower gain for LNA 300. The bias current of LNA 300 may be reduced in order to lower the gain of LNA 300. However, reducing the bias current would also decrease the real part of the input impedance of LNA 300, which may adversely impact input matching of LNA 300. The real part of the input impedance may be largely dependent on the inductance of source degeneration inductor 332. The adverse impact to input matching may be mitigated by maintaining the bias current within a range of values, e.g., from Ibias_max to Ibias_min, with Ibias_max corresponding to a maximum gain and Ibias_min corresponding to a minimum gain of LNA 300. Current bleeding may be used to further reduce the gain of LNA 300 after the bias current has been reduced to the Ibias_min limit. For current bleeding, cascode transistors 336 and 338 may both be turned ON, and cascode transistor 338 may conduct some of the current flowing through gain transistor 334. Cascode transistor 336 would then conduct a smaller amount of current as a result of current bleeding by cascode transistor 338, which then reduces the gain of LNA 300. However, current bleeding is not an efficient way to reduce the gain of LNA 300 since the current that is bled away via cascode transistor 338 consumes battery power but is not effectively used to improve performance. Furthermore, current bleeding may degrade the linearity of LNA 300, and the degraded linearity of LNA 300 may limit the overall linearity of a receiver.

In general, an LNA or a receiver may saturate when a strong jammer is present, which may then degrade signal-to-noise ratio (SNR). One way to avoid saturation is to reduce the gain of the LNA by reducing the bias current. However, if the bias current is reduced too much, then input matching by a source degeneration inductor would be adversely impacted. Hence, the bias current may be reduced by an amount that is limited by input matching constraint. Limiting the bias current to a certain minimum amount would result in a limited dynamic range for the LNA. The LNA may then be unable to handle strong jammers exceeding a certain level without excessively degrading SNR.

In an aspect of the present disclosure, an amplifier may include inductive degeneration, configurable gain, and configurable input matching to obtain good performance for different signal conditions. The bias current of the amplifier may be varied over a wider range in order to vary the gain of the amplifier over a desired range of gain values. The bias current may be reduced lower than a point where the input matching of the amplifier may be adversely impacted beyond a desired limit. Changes in the input impedance of the amplifier due to the lower bias current may be accounted for by the configurable input matching of the amplifier. For example, an input matching circuit may be selectively coupled depending on the gain of the amplifier. Input matching of the amplifier may be achieved with the input matching circuit when needed. The amplifier may thus have a wider gain range, lower power consumption at low gain, good dynamic range and good input matching over the entire gain range, and/or other desirable characteristics.

Figure 4:
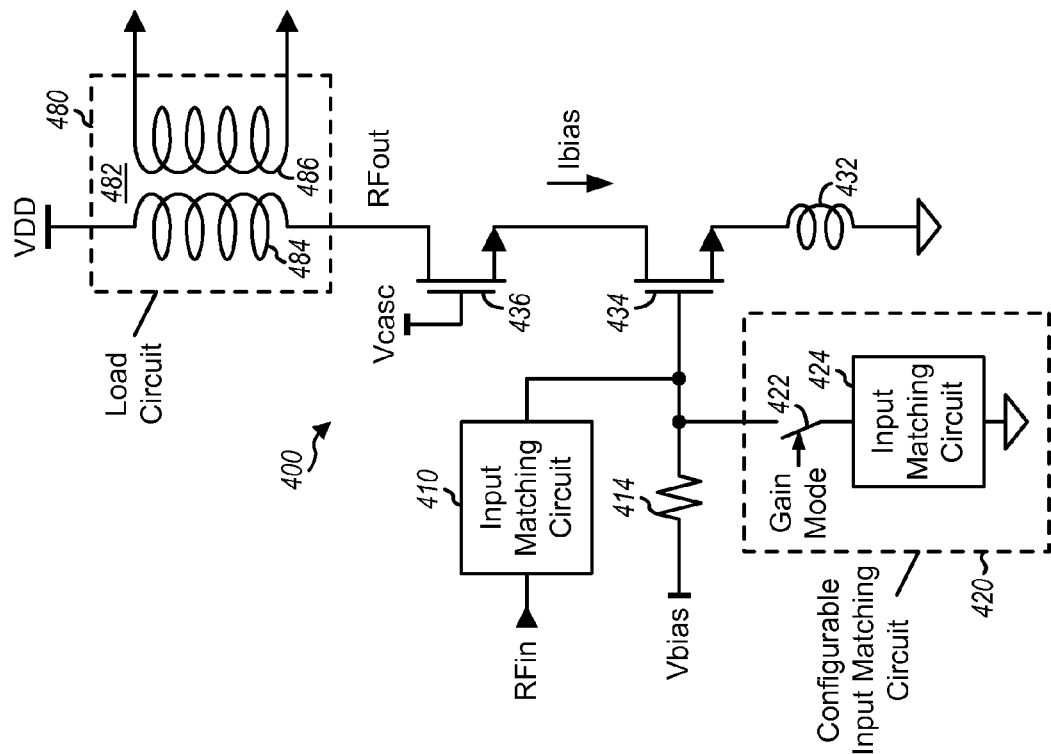
FIG. 4 shows a schematic diagram of an exemplary design of an LNA with inductive degeneration and configurable gain and input matching.

FIG. 4 shows a schematic diagram of an exemplary design of an LNA 400 with inductive degeneration, configurable gain, and configurable input matching. LNA 400 may be used for any of LNAs 230 and 232 in FIG. 2. LNA 400 includes a source degeneration inductor 432, a gain transistor 434, a cascode transistor 436, and a configurable input matching circuit 420.

An input matching circuit 410 has one end receiving an input RF signal (RFin) and the other end coupled to the gate of gain transistor 434. Gain transistor 434 has its source coupled to one end of inductor 432 and its drain coupled to the source of cascode transistor 436. The other end of inductor 432 is coupled to circuit ground. Cascode transistor 436 has its gate receiving a control signal (Vcasc) and its drain coupled to a load circuit 480. Gain transistor 434 and cascode transistor 436 may be implemented with NMOS transistors, as shown in FIG. 4, or with transistors of other types. A resistor 414 has one end coupled to the gate of gain transistor 432 and the other end receiving a bias voltage (Vbias) for gain transistor 434. Input matching circuit 410 and resistor 414 may be considered as part of LNA 400 or as being external to LNA 400.

Configurable input matching circuit 420 is coupled between the gate of gain transistor 434 and circuit ground. In the exemplary design shown in FIG. 4, configurable input matching circuit 420 includes a switch 422 and an input matching circuit 424. Switch 422 has one end coupled to the gate of gain transistor 434 and the other end coupled to input matching circuit 424, which is further coupled to circuit ground. Switch 422 may be opened or closed by a gain control signal (Gain Mode).

In the exemplary design shown in FIG. 4, load circuit 480 includes a transformer 482 comprising a primary coil 484 and a secondary coil 486. Primary coil 484 is coupled between the drain of cascode transistor 436 and the VDD supply. Secondary coil 486 provides a differential output RF signal to a downconverter (not shown in FIG. 4). Load circuit 480 may also be implemented in other manners. In another exemplary design, a load circuit may include an inductor and possibly a capacitor coupled between the VDD supply and the drain of cascode transistor 436. In yet another exemplary design, a load circuit may include a P-channel metal oxide semiconductor (PMOS) transistor having its source coupled to the VDD supply and its drain coupled to the drain of cascode transistor 436. The PMOS transistor may provide an active load for cascode transistor 436.

LNA 400 may also be implemented in other manners. In another exemplary design, an LNA may include two gain transistors coupled in parallel and having their gates receiving the input RF signal. A first gain transistor may have its source coupled to a degeneration inductor, as shown in FIG. 4. A second gain transistor may have its source coupled directly to circuit ground. Either the first or second gain transistor may be selected, e.g., depending on signal conditions. In another exemplary design, an LNA may include a feedback circuit coupled between an output and an input of the LNA. The feedback circuit may comprise a resistor, a capacitor, a transistor, some other circuit component, or a combination thereof. The feedback circuit may help with input matching and may also improve linearity of the LNA.

In another exemplary design, an LNA may include a cascode circuit in place of a cascode transistor. The cascode circuit may include (i) a first cascode transistor coupled between the drain of a gain transistor and an intermediate node, (ii) a second cascode transistor coupled between the intermediate node and an output of the LNA, and (iii) a shunt transistor coupled between the intermediate node and circuit ground. When the cascode circuit is enabled, the first and second cascode transistors may be turned ON to provide an output RF signal at the LNA output, and the shunt transistor may be turned OFF. When the cascode circuit is disabled, the first and second cascode transistors may be turned OFF to provide no output RF signal at the LNA output, and the shunt transistor may be turned ON to pull the intermediate node to circuit ground and provide better isolation between the LNA output and the gain transistor. Better isolation may be desirable when the same load circuit is shared by multiple gain transistors, e.g., in different LNAs.

In an exemplary design, inductor 432 may have a fixed inductance. In another exemplary design, inductor 432 may be a configurable inductor having a variable or programmable inductance. For example, inductor 432 may be implemented with multiple inductors coupled in series and/or multiple inductors coupled in parallel. Different inductance values may be obtained by (i) shorting one or more series-coupled inductors via one or more switches and/or (ii) disconnecting one or more parallel-coupled inductors via one or more switches.

Within LNA 400, gain transistor 434 amplifies the RFin signal and provides an amplified signal. Cascode transistor 436 buffers the amplified signal and provides an output RF signal (RFout) to load circuit 480. Source degeneration inductor 432 enables LNA 400 to obtain good dynamic range (e.g., good noise figure) and achieve high sensitivity and also helps with input matching of LNA 400.

LNA 400 may support multiple gain modes, which may include a high-gain mode and a low-gain mode. LNA 400 may operate in the high-gain mode and provide a desired high gain when jammers are not present in the input RF signal. LNA 400 may operate in the low-gain mode and provide a lower gain when a jammer is present in the input RF signal. LNA 400 may have a lower gain in the low-gain mode than in the high-gain mode, which may help a receiver meet linearity requirements in the presence of a jammer Each gain mode may be associated with a particular gain value or a range of gain values for LNA 400.

In the high-gain mode, gain transistor 434 may be biased with a sufficient amount of bias current to obtain the desired high gain, linearity, noise figure, and dynamic range for LNA 400. Switch 422 may be opened, and input matching circuit 424 may be disconnected from the gate of gain transistor 434. LNA 400 may have an input impedance of Zin_hg in the high-gain mode, and this input impedance may be largely determined by the inductance of source degeneration inductor 432. Input matching circuit 410 may provide input matching for LNA 400 in the high-gain mode and may be designed to match to the Zin_hg impedance.

In the low-gain mode, gain transistor 434 may be biased with less bias current in order to reduce the gain of LNA 400. Switch 422 may be closed, and input matching circuit 424 may be connected to the gate of gain transistor 434. Reducing the bias current of gain transistor 434 would decrease the real part of the input impedance of LNA 400, which may be largely dependent on the inductance of source degeneration inductor 432. Input matching circuit 424 may account for the decrease in the real part of the input impedance of LNA 400, so that LNA 400 has an input impedance sufficiently close to Zin_hg in the low-gain mode. Input matching circuit 410 may then provide good input matching for LNA 400 in the low-gain mode. Equivalently, input matching of LNA 400 may be considered as being performed by a combination of input matching circuits 410 and 424 in the low-gain mode.

Configurable input matching circuit 420 may enable input matching of LNA 400 in the low-gain mode to be independent of source degeneration inductor 432. Therefore, constraints between power consumption and input matching of LNA 400 may be relaxed. The bias current of gain transistor 434 may be set (e.g., reduced) based on dynamic range requirement of LNA 400 in the low-gain mode and is not limited by input matching requirements of LNA 400.

In the exemplary design shown in FIG. 4, configurable input matching circuit 420 is coupled between the gate of gain transistor 434 and circuit ground. A configurable input matching circuit may also be placed at other locations or nodes of an LNA. For example, a configurable input matching circuit may be coupled between the source or drain of a gain transistor and circuit ground, or between the gate and source of the gain transistor, or at some other location or node of the LNA.

Configurable input matching circuit 420 may be implemented in various manners. Some exemplary designs of configurable input matching circuit 420 are described below.

Figure 5B:
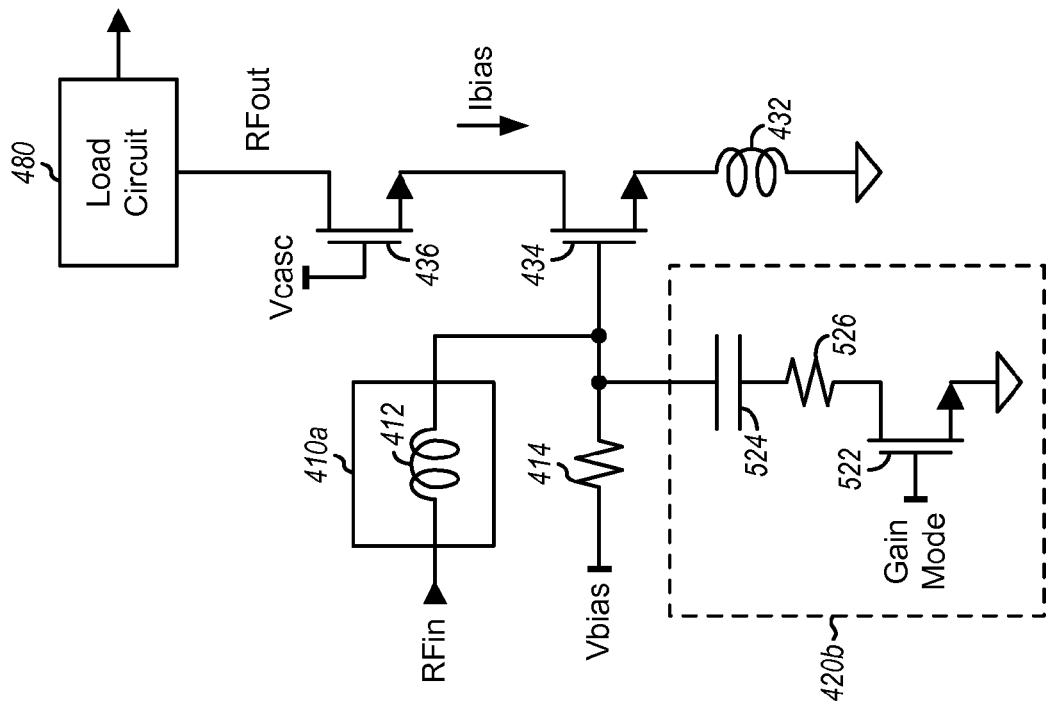
FIGS. 5A to 5D show schematic diagrams of four exemplary designs of a configurable input matching circuit.
Figure 5A:
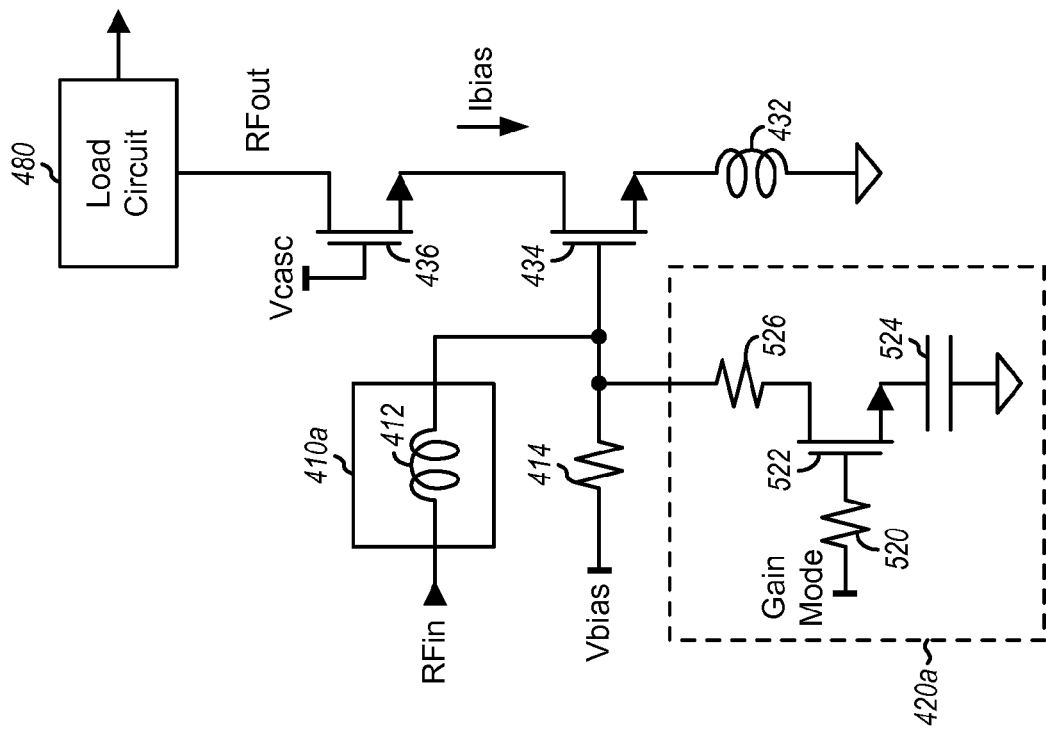

FIG. 5A shows a schematic diagram of a configurable input matching circuit 420a, which is a first exemplary design of configurable input matching circuit 420 in FIG. 4. Within configurable input matching circuit 420a, a transistor 522 has its source coupled to one end of a capacitor 524, its gate coupled to one end of a resistor 520, and its drain coupled to one end of a resistor 526. The other end of capacitor 524 is coupled to circuit ground. The other end of resistor 520 receives the Gain Mode control signal. The other end of resistor 526 is coupled to the gate of gain transistor 434. The arrangement of transistor 522, capacitor 524, and resistor 526 in FIG. 5A may allow LNA 400 to achieve high sensitivity in the high-gain mode when input matching circuit 420 is not in use, with transistor 522 being turned OFF.

In the exemplary design shown in FIG. 5A, input matching circuit 420a includes an RC network composed of resistor 526 and capacitor 524. The RC network can account for changes in the input impedance of LNA 400 due to reduced bias current in the low-gain mode. In particular, resistor 526 assists with input matching of LNA 400 in the low-gain mode. Capacitor 524 acts as an alternating current (AC) coupling capacitor that avoids disturbance of the Vbias voltage. Transistor 522 operates as a switch, which corresponds to switch 422 in FIG. 4. Transistor 522 may be (i) turned ON to connect the RC network to the gate of gain transistor 434 or (ii) turned OFF to disconnect the RC network from the gate of gain transistor 434. Resistor 520 allows LNA 400 to achieve high sensitivity (or low noise figure) in the high-gain mode. Resistor 520 reduces the parasitics capacitance to ground at an intermediate node between the drain of transistor 522 and resistor 526. This may prevent the noise of resistor 520 from leaking when input matching circuit 420 is not in use and degrading the sensitivity of LNA 400 in the high-gain mode.

In the exemplary design shown in FIG. 5A, an input matching circuit 410a comprises an inductor 412 coupled between the input and output of input matching circuit 410a. A single circuit component (e.g., only inductor 412) may be sufficient to obtain good input matching for LNA 400 in the high-gain mode. Inductor 412 may be designed to provide good input matching in the high-gain mode with the high bias current for gain transistor 434, the nominal source degeneration inductance provided by inductor 432, and configurable input matching circuit 420 being disconnected or decoupled from the gate of gain transistor 434. Input matching of LNA 400 may be degraded in the low-gain mode due to less bias current for gain transistor 434. However, configurable input matching circuit 420 may improve input matching of LNA 400 in the low-gain mode.

Input matching circuit 410a may also be implemented in other manners. For example, input matching circuit 410a may comprise a shunt capacitor coupled between the input and circuit ground, or a shunt capacitor coupled between the output and circuit ground, or a capacitor coupled between the input and output of input matching circuit 410, or some other circuit component coupled in other manners, or a combination thereof. Each capacitor may be a fixed capacitor or a configurable capacitor.

In general, input matching for an LNA may be achieved with an active circuit (e.g., comprising one or more transistors) and/or a passive circuit (e.g., comprising one or more resistors, inductors, capacitors, etc.). It may be desirable to use only one circuit component (e.g., one inductor) for input matching in order to reduce cost, power consumption, and circuit area. It may also be desirable to use the same circuit component (e.g., the same inductor) for input matching in both the high-gain mode and the low-gain mode.

FIG. 5B shows a schematic diagram of a configurable input matching circuit 420b, which is a second exemplary design of configurable input matching circuit 420 in FIG. 4. Within configurable input matching circuit 420b, transistor 522 has its source coupled to circuit ground, its gate receiving the Gain Mode control signal, and its drain coupled to one end of resistor 526. The other end of resistor 526 is coupled to one end of capacitor 524. The other end of capacitor 524 is coupled to the gate of gain transistor 434. Capacitor 524 and resistor 526 are coupled in series and form an RC network. Transistor 522 is coupled in series with the RC network and operates as a switch that can be (i) turned ON to connect the RC network to the gate of gain transistor 434 or (ii) turned OFF to disconnect the RC network from the gate of gain transistor 434.

Figure 5D:
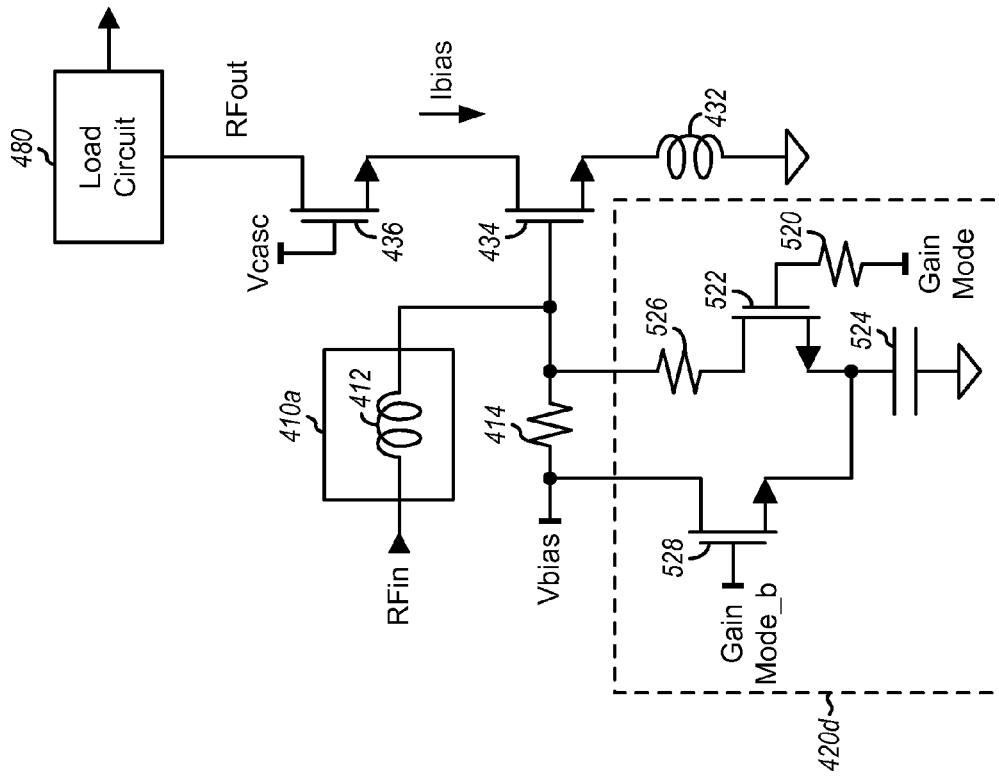
Figure 5C:
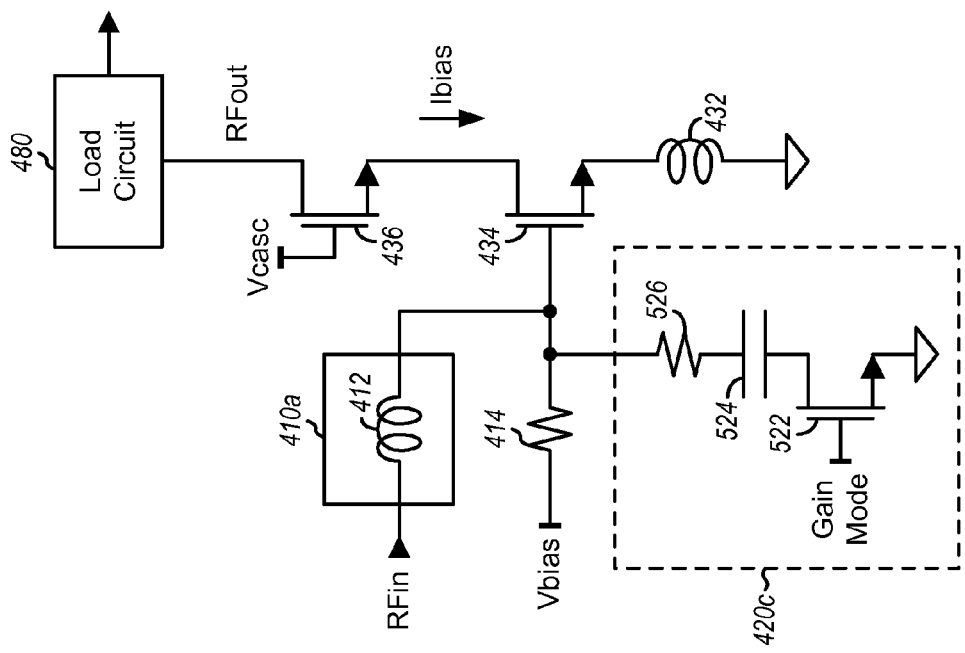

FIG. 5C shows a schematic diagram of a configurable input matching circuit 420c, which is a third exemplary design of configurable input matching circuit 420 in FIG. 4. Within configurable input matching circuit 420c, transistor 522 has its source coupled to circuit ground, its gate receiving the Gain Mode control signal, and its drain coupled to one end of capacitor 524. The other end of capacitor 524 is coupled to one end of resistor 526. The other end of resistor 526 is coupled to the gate of gain transistor 434. Capacitor 524 and resistor 526 are coupled in series and form an RC network. Transistor 522 is coupled in series with the RC network and can be (i) turned ON to connect the RC network to the gate of gain transistor 434 or (ii) turned OFF to disconnect the RC network from the gate of gain transistor 434.

FIG. 5D shows a schematic diagram of a configurable input matching circuit 420d, which is a fourth exemplary design of configurable input matching circuit 420 in FIG. 4. Configurable input matching circuit 420d includes transistor 522, capacitor 524, and resistor 526, which are coupled as described above for configurable input matching circuit 420a in FIG. 5A. Configurable input matching circuit 420d further includes a transistor 528 having its source coupled to capacitor 524, its gate receiving a complementary gain control signal (Gain Mode_b), and its drain coupled to the Vbias voltage. The Gain Mode_b signal is complementary to the Gain Mode signal.

Transistor 528 may be used to pre-charge capacitor 524 to facilitate fast switching between the high-gain mode and the low-gain mode. In the high-gain mode, transistor 522 is turned OFF by the Gain Mode signal, and transistor 528 is turned ON by the Gain Mode_b signal. Capacitor 524 is disconnected from the gate of transistor 434 and is pre-charged to the Vbias voltage via transistor 528 in the high-gain mode. In the low-gain mode, transistor 522 is turned ON by the Gain Mode signal, and transistor 528 is turned OFF by the Gain Mode_b signal. Capacitor 524 is connected to the gate of transistor 434 and is maintained at the Vbias voltage via resistor 526 and transistor 522 in the low-gain mode. By pre-charging capacitor 524 via transistor 528 in the high-gain mode, a switch from the high-gain mode to the low-gain mode may be done more quickly.

FIGS. 5A to 5D show some exemplary designs of a configurable input matching circuit comprising an RC network to assist input matching of an LNA in the low-gain mode. A configurable input matching circuit may also include different and/or additional circuit components. In an exemplary design, an inductor may be used in place of, or in addition to, resistor 526. In another exemplary design, a capacitor may be coupled in parallel with resistor 526. In yet another exemplary design, a capacitor and an inductor may be coupled in parallel and may replace resistor 526.

Figure 6:
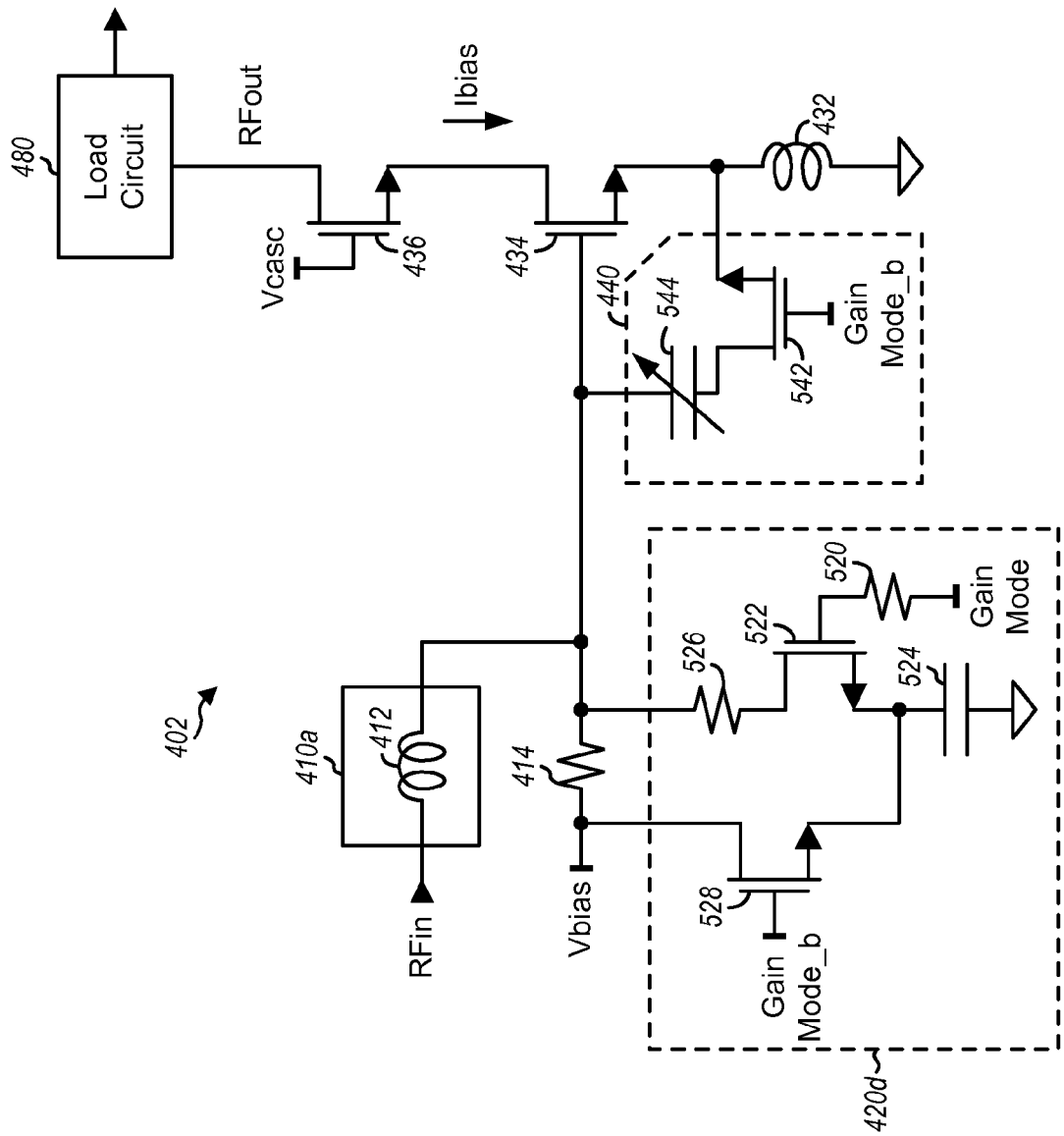
FIG. 6 shows a schematic diagram of another exemplary design of an LNA with inductive degeneration and configurable gain and input matching.

FIG. 6 shows a schematic diagram of an exemplary design of an LNA 402 with inductive degeneration, configurable gain, and configurable input matching. LNA 402 may be used for any of LNAs 230 and 232 in FIG. 2. LNA 402 includes all circuit components in LNA 400 in FIG. 4. LNA 402 further includes a configurable matching capacitor 440 coupled between the gate and source of gain transistor 434. In the exemplary design shown in FIG. 6, configurable matching capacitor 440 includes a transistor 542 and an adjustable capacitor 544. Transistor 542 has its source coupled to the source of gain transistor 434, its gate receiving the Gain Mode_b control signal, and its drain coupled to one end of capacitor 544. The other end of capacitor 544 is coupled to the gate of gain transistor 434. Adjustable capacitor 544 may be used to adjust the input impedance of LNA 402 and to assist with input matching of LNA 402.

Adjustable capacitor 544 may be implemented in various manners. In an exemplary design, adjustable capacitor 544 may be implemented with a variable capacitor (varactor) having a capacitance that can be varied by an analog voltage. In another exemplary design, adjustable capacitor 544 may be implemented with a bank of switchable capacitors. Each switchable capacitor may be implemented with a capacitor coupled in series with a switch, and the series combination may be coupled between the gate and source of gain transistor 434. A switchable capacitor may be selected by closing its switch or unselected by opening its switch. The capacitors in the bank of switchable capacitors may have (i) the same capacitance for thermometer decoding or (ii) different capacitances for binary or geometric weighting. A desired gate-to-source capacitance (Cgs) may be obtained by selecting an appropriate number or an appropriate combination of switchable capacitors. In this exemplary design, transistor 542 may be replaced with the switches for the switchable capacitors and may be omitted.

In an exemplary design, transistor 542 may be turned ON, and adjustable capacitor 544 may be coupled between the gate and source of gain transistor 434 in the high-gain mode. Transistor 542 may be turned OFF, and adjustable capacitor 544 may be decoupled from gain transistor 434 in the low-gain mode to allow greater reduction of bias current in the low-gain mode. Decoupling adjustable capacitor 544 may also increase the quality factor (Q) of an input tank circuit formed by inductors 412 and 432 and parasitics capacitance between the gate and source of gain transistor 434. The higher Q of the input tank circuit may enable further reduction of the bias current in the low-gain mode.

Wireless device 110 may concurrently receive multiple transmitted signals at different frequencies. These multiple transmitted signals may be sent by one or more base stations on multiple carriers at different frequencies for carrier aggregation. These multiple transmitted signals may also be sent by different base stations for coordinated multi-point (CoMP) transmission, handover, etc. These multiple transmitted signals may also be sent by base stations in different wireless systems for concurrent services such as voice/data, or data/data, or voice/voice, etc. For example, wireless device 110 may support dual SIM/dual standby (DSDS) and/or dual SIM/dual-active (DSDA) and may be able to concurrently communicate with multiple wireless systems such as TD-SCDMA and GSM systems, or LTE and GSM systems, or CDMA and GSM systems, etc. Wireless device 110 may include one or more SIMO LNAs and/or one or more MIMO LNAs to support carrier aggregation, CoMP, concurrently services from multiple wireless systems, etc.

Figure 7A:
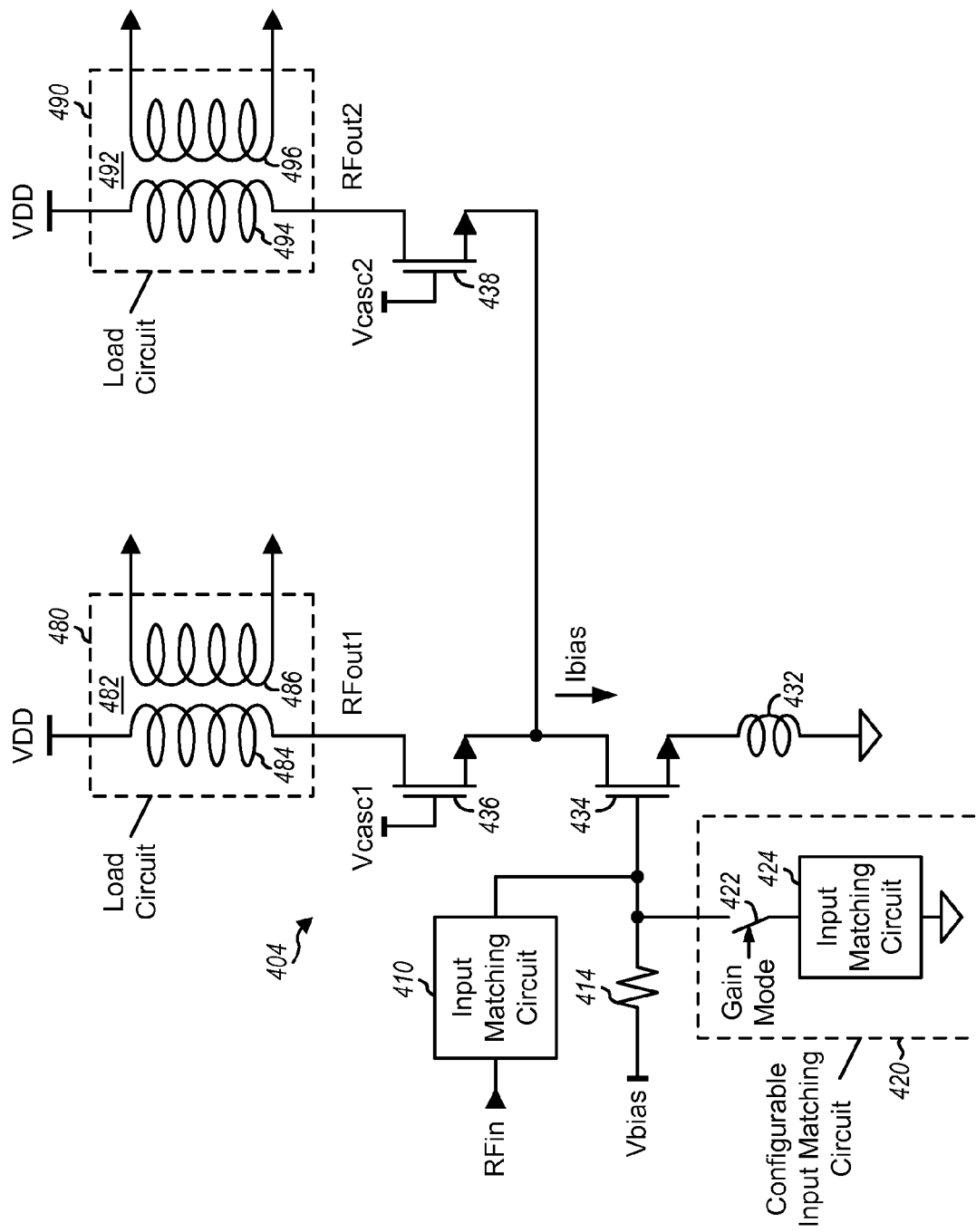
FIGS. 7A and 7B show schematic diagrams of two exemplary designs of a single-input multiple-output (SIMO) LNA with inductive degeneration and configurable gain and input matching.

FIG. 7A shows a schematic diagram of an exemplary design of a SIMO LNA 404 with inductive degeneration, configurable gain, and configurable input matching. LNA 404 may be used for any of LNAs 230 and 232 in FIG. 2. LNA 404 includes one input receiving one input RF signal (RFin) (e.g., for one band) and two outputs providing two output RF signals (RFout1 and RFout2) (e.g., for two sets of carriers). LNA 404 includes all circuit components in LNA 400 in FIG. 4. LNA 404 further includes a second cascode transistor 438 having its source coupled to the drain of gain transistor 434, its gate receiving a second control signal (Vcasc2), and its drain coupled to a load circuit 490. Load circuit 490 includes a transformer 492 comprising a primary coil 494 and a secondary coil 496. Primary coil 494 is coupled between the drain of cascode transistor 438 and the VDD supply. Secondary coil 496 provides a differential output RF signal to a second downconverter (not shown in FIG. 7A).

For simplicity, FIG. 7A shows SIMO LNA 404 including two cascode transistors 436 and 438 to provide up to two output RF signals to up to two load circuits 480 and 490, e.g., for up to two sets of carriers being received concurrently for carrier aggregation. In general, a SIMO LNA may include N cascode transistors coupled to N load circuits to provide up to N output RF signals, where N may be any integer value greater than one.

SIMO LNA 404 may operate in a single-output mode or a multi-output mode at any given moment. In the single-output mode, LNA 404 receives an input RF signal comprising at least one transmitted signal (e.g., on one set of carriers) and provides one output RF signal via one cascode transistor 436 or 438 to one downconverter. In the multi-output mode, LNA 404 receives an input RF signal comprising at least two transmitted signals (e.g., on two sets of carriers) and provides two output RF signals via two cascode transistors 436 and 438 to two downconverters (e.g., one output RF signal for each set of carriers).

In an exemplary design, gain transistor 434 may be applied (i) a lower bias current of Ib1 in the single-output mode or (ii) a higher bias current of Ib2 in the multi-output mode, where Ib2>Ib1. The Ib1 bias current may be selected to obtain a desired dynamic range for LNA 404 in the single-output mode. The Ib2 bias current may be selected to obtain a desired dynamic range for LNA 404 in the multi-output mode. For example, the Ib1 bias current may be selected to obtain similar dynamic range for LNA 404 in the single-output mode as in the multi-output mode. The Ib2 bias current may be twice the Ib1 bias current (e.g., Ib2=2*Ib1) or some other integer or non-integer multiple of the Ib1 bias current (e.g., Ib2=m*Ib1, where m>1).

In an exemplary design, switch 422 may be opened, and input matching circuit 424 may be disconnected from the gate of gain transistor 434 in the multi-output mode when gain transistor 434 is applied the higher Ib2 bias current. Switch 422 may be closed, and input matching circuit 424 may be connected to the gate of gain transistor 434 in the single-output mode when gain transistor 434 is applied the lower Ib1 bias current.

In an exemplary design, LNA 404 may support multiple gain modes in the single-output mode and/or the multi-output mode. For example, a high-gain mode and a low-gain mode may be supported in the multi-output mode. Alternatively or additionally, a high-gain mode and a low-gain mode may be supported in the single-output mode. Different gains for different gain modes may be obtained by varying the bias current of gain transistor 434. Configurable input matching circuit 420 may be connected to the gate of gain transistor 434 in the low-gain mode and disconnected from the gate of gain transistor 434 in the high-gain mode, e.g., as described above for FIG. 4.

Figure 7B:
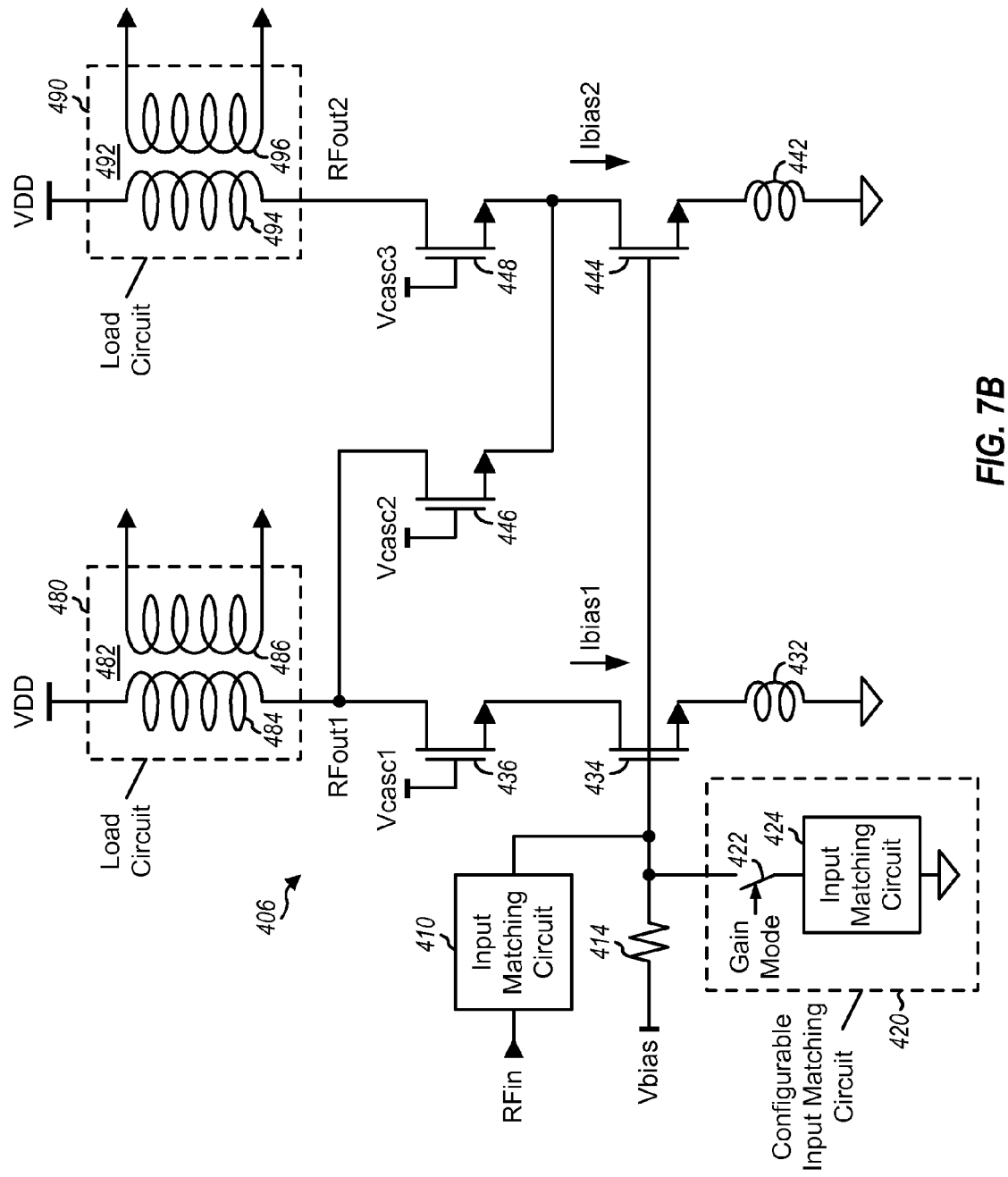

FIG. 7B shows a schematic diagram of another exemplary design of a SIMO LNA 406 with inductive degeneration, configurable gain, and configurable input matching. LNA 406 may be used for any of LNAs 230 and 232 in FIG. 2. LNA 406 includes all circuit components in LNA 404 in FIG. 7A, except for cascode transistor 438. LNA 406 further includes a second gain transistor 444, a second source degeneration inductor 442, and cascode transistors 446 and 448. Gain transistor 444 has its source coupled to one end of inductor 442, its gate coupled to the gate of gain transistor 434, and its drain coupled to the sources of cascode transistors 446 and 448. The other end of inductor 442 is coupled to circuit ground. Cascode transistor 446 has its gate receiving a second control signal (Vcasc2) and its drain coupled to load circuit 480. Cascode transistor 448 has its gate receiving a third control signal (Vcasc3) and its drain coupled to load circuit 490. Although not shown in FIG. 7B, LNA 406 may further include a fourth cascode transistor having its source coupled to the drain of gain transistor 434, its gate receiving a fourth control signal, and its drain coupled to load circuit 490.

SIMO LNA 406 may operate in a single-output mode or a multi-output mode at any given moment. In the single-output mode, LNA 406 receives an input RF signal comprising at least one transmitted signal (e.g., on one set of carriers) and provides one output RF signal to one load circuit 480 or 490. For example, both gain transistors 434 and 444 and cascode transistors 436 and 446 may be enabled to generate the RFout1 signal for load circuit 480. Alternatively, gain transistor 444 and cascode transistor 448 may be enabled to generate the RFout2 signal for load circuit 490. In the multi-output mode, LNA 406 receives an input RF signal comprising at least two transmitted signals (e.g., on two sets of carriers) and provides two output RF signals to two load circuits 480 and 490 (e.g., one output RF signal for each set of carriers). Gain transistors 434 and 444 and cascode transistors 436 and 448 may be enabled to generate the RFout1 and RFout2 signals for load circuits 480 and 490.

In an exemplary design, gain transistors 434 and 444 may be applied (i) lower bias currents of Ib1a and Ib1b, respectively, in the single-output mode or (ii) higher bias currents of Ib2a and Ib2b, respectively, in the multi-output mode, where Ib2a>Ib1a and Ib2b>Ib1b. The Ib1a and Ib1b bias currents may be selected to obtain a desired dynamic range for LNA 406 in the single-output mode. The Ib2a and Ib2b bias currents may be selected to obtain a desired dynamic range for LNA 406 in the multi-output mode. For example, the Ib1a, Ib1b, Ib2a and Ib2b bias currents may be selected to obtain similar dynamic range for LNA 406 in the single-output mode and the multi-output mode.

In an exemplary design, switch 422 may be opened, and input matching circuit 424 may be disconnected from the gate of gain transistor 434 in the multi-output mode when gain transistors 434 and 444 are applied the higher Ib2a and Ib2b bias currents. Switch 422 may be closed, and input matching circuit 424 may be connected to the gates of gain transistors 434 and 444 in the single-output mode when gain transistors 434 and 444 are applied the lower Ib1a and Ib1b bias currents.

Figure 8:
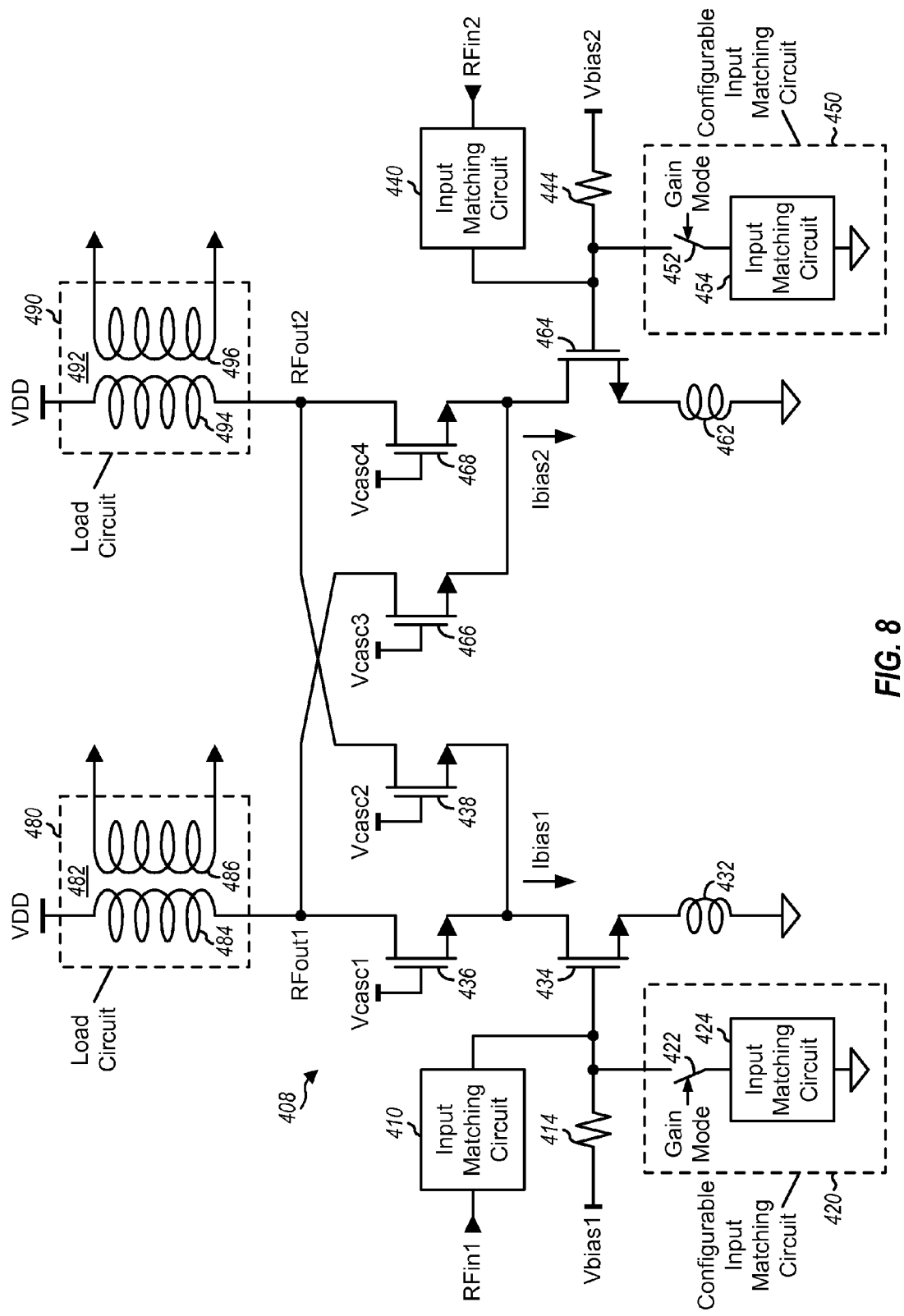
FIG. 8 shows a schematic diagram of a multiple-input multiple-output (MIMO) LNA with inductive degeneration and configurable gain and input matching.

FIG. 8 shows a schematic diagram of an exemplary design of a MIMO LNA 408 with inductive degeneration, configurable gain, and configurable input matching. LNA 408 may be used for any of LNAs 230 and 232 in FIG. 2. LNA 408 includes two inputs receiving two input RF signals (RFin1 and RFin2) (e.g., for two bands) and two outputs providing two output RF signals (RFout1 and RFout2) (e.g., for two sets of carriers). LNA 408 includes all circuit components in LNA 404 in FIG. 7A. LNA 408 further includes a second source degeneration inductor 462, a second gain transistor 464, cascode transistors 466 and 468, and a configurable input matching circuit 450.

An input matching circuit 440 has one end receiving a second input RF signal (RFin2) and the other end coupled to the gate of gain transistor 464. Gain transistor 464 has its source coupled to one end of inductor 462 and its drain coupled to the sources of cascode transistors 466 and 468. The other end of inductor 462 is coupled to circuit ground. Cascode transistor 466 has its gate receiving a third control signal (Vcasc3) and its drain coupled to load circuit 480. Cascode transistor 468 has its gate receiving a fourth control signal (Vcasc4) and its drain coupled to load circuit 490.

A resistor 444 has one end coupled to the gate of gain transistor 464 and the other end receiving a second bias voltage (Vbias2). Input matching circuit 440 and resistor 444 may be considered as part of LNA 408 or as being external to LNA 408.

Configurable input matching circuit 450 is coupled between the gate of gain transistor 464 and circuit ground. Within configurable input matching circuit 450, a switch 452 has one end coupled to the gate of gain transistor 464 and the other end coupled to an input matching circuit 454, which is further coupled to circuit ground. Switch 452 may be opened or closed by the gain control signal (Gain Mode).

For simplicity, FIG. 8 shows MIMO LNA 408 including two gain transistors 434 and 464 for two inputs and four cascode transistors 436, 438, 466 and 468 for two inputs and two outputs. In general, a MIMO LNA may include M gain transistors for M inputs and up to M*N cascode transistors for M inputs and N outputs, where M and N may each be any integer value greater than one. For example, N cascode transistors may be coupled between each gain transistor and the N outputs to allow an input RF signal at any of the M inputs to be amplified and provided to any of the N outputs. Fewer than N cascode transistors may also be coupled to each gain transistor.

MIMO LNA 408 may operate in a single-output mode or a multi-output mode at any given moment. In the single-output mode, LNA 408 receives the RFin1 and/or RFin2 signal comprising at least one transmitted signal (e.g., on one set of carriers) and provides one output RF signal via one cascode transistor 436, 438, 466 or 468 to one downconverter. In the multi-output mode, LNA 408 receives the RFin1 or RFin2 signal comprising at least two transmitted signals (e.g., on two sets of carriers) and provides two output RF signals via two of cascode transistors 436, 438, 466 and 468 to two downconverters (e.g., one output RF signal for each set of carriers).

In an exemplary design, gain transistor 434 or 464 may be applied (i) a lower bias current of Ib1 in the single-output mode or (ii) a higher bias current of Ib2 in the multi-output mode, where Ib2>Ib1. The Ib1 bias current may be selected to obtain a desired dynamic range for LNA 408 in the single-output mode. The Ib2 bias current may be selected to obtain a desired dynamic range for LNA 408 in the multi-output mode.

In an exemplary design, input matching circuit 424 may be (i) disconnected from the gate of gain transistor 434 in the multi-output mode when gain transistor 434 is applied the higher Ib2 bias current and (ii) connected to the gate of gain transistor 434 in the single-output mode when gain transistor 434 is applied the lower Ib1 bias current. Similarly, input matching circuit 454 may be (i) disconnected from the gate of gain transistor 464 in the multi-output mode when gain transistor 464 is applied the higher Ib2 bias current and (ii) connected to the gate of gain transistor 464 in the single-output mode when gain transistor 464 is applied the lower Ib1 bias current.

In an exemplary design, LNA 408 may support multiple gain modes (e.g., a high-gain mode and a low-gain mode) in the single-output mode and/or the multi-output mode. Different gains for different gain modes may be obtained by varying the bias current of gain transistor 434 or 464. Configurable input matching circuits 420 (or 450) may be connected to the gate of gain transistor 434 (or 464) in the low-gain mode and disconnected from the gate of gain transistor 434 (or 464) in the high-gain mode.

Amplifiers with inductive degeneration and configurable gain and input matching disclosed herein may provide various advantages. First, these amplifiers may be able to achieve the required dynamic range over a range of gain values, e.g., in the high-gain and low-gain modes. Second, the amplifiers may consume less power to achieve the required dynamic range than an amplifier that uses current bleeding. Lower power consumption may be highly desirable for a portable wireless device such as a cellular phone or a smartphone. Third, a configurable input matching circuit may improve performance of an amplifier in the low-gain mode while having negligible impact on the performance of the amplifier in the high-gain mode where high sensitivity may be required. Fourth, the configurable input matching circuit may relax input matching requirements of the amplifier, which may enable a single circuit component (e.g., single inductor 412 in FIG. 5A) to be used for input matching of the amplifier. Fifth, the configurable input matching circuit may be used for different band groups including low-band, mid-band, and high-band. Other advantages may also be provided by the amplifiers with inductive degeneration and configurable gain and input matching disclosed herein.

Computer simulation was performed to determine the performance of a conventional receiver that includes LNA 300 in FIG. 3 and a novel receiver that includes LNA 400 in FIG. 4. The computer simulation indicates that the novel receiver can achieve similar performance as the conventional receiver in the low-gain mode. In particular, the novel receiver can provide similar performance in terms of gain, noise figure, and linearity as measured by third-order interception point (IIP3) as compared to the conventional receiver in the low-gain mode. The computer simulation also indicates that the novel receiver can achieve similar performance as the conventional receiver while consuming about 40% of the bias current required by the conventional receiver.

In an exemplary design, an apparatus (e.g., a wireless device, an IC, a circuit module, etc.) may include a gain transistor, an inductor, and an input matching circuit, all of which may be part of an amplifier, e.g., an LNA. The gain transistor (e.g., gain transistor 434 in FIG. 4) may have a variable gain determined based on a bias current of the gain transistor. The inductor (e.g., inductor 432) may be coupled between the gain transistor and circuit ground. The input matching circuit (e.g., configurable input matching circuit 420) may be selectively coupled to the gain transistor based on the variable gain of the gain transistor. In an exemplary design, the input matching circuit may be coupled to the gain transistor in a low-gain mode and decoupled from the gain transistor in the high-gain mode. The bias current and the gain of the gain transistor may be lower in the low-gain mode than in the high-gain mode.

In an exemplary design, the input matching circuit may comprise a resistor and a second transistor. The resistor (e.g., resistor 526 in FIGS. 5A to 5D) may be used for input matching of the amplifier when the input matching circuit is coupled to the gain transistor. The second transistor (e.g., transistor 522) may be operable to couple the resistor to the gain transistor or decouple the resistor from the gain transistor. The input matching circuit may further comprise a capacitor (e.g., capacitor 524) coupled in series with the resistor and the second transistor. In an exemplary design shown in FIG. 5A, the capacitor may be coupled between a source of the second transistor and circuit ground, and the resistor may be coupled between a drain of the second transistor and a gate of the gain transistor. The resistor, the capacitor, and the second transistor may also be coupled in other manners, e.g., as shown in FIGS. 5B and 5C.

In an exemplary design, the input matching circuit may further comprise a third transistor (e.g., transistor 528 in FIG. 5D) coupled between a bias voltage and the capacitor. The third transistor may pre-charge the capacitor to the bias voltage when the input matching circuit is decoupled from the gain transistor.

In an exemplary design, a capacitor and a fourth transistor may be coupled to the gain transistor. The capacitor (e.g., capacitor 544 in FIG. 6) may be used for input matching of the amplifier. The fourth transistor (e.g., transistor 542 in FIG. 6) may be coupled to the capacitor and the gain transistor and may couple or decouple the capacitor between the gate and the source of the gain transistor. The capacitor may have an adjustable capacitance and may be varied to obtain good input matching for the amplifier.

In an exemplary design, the apparatus may further include a second input matching circuit (e.g., input matching circuit 410 in FIG. 4), which may be coupled to the gate of the gain transistor and may receive an input RF signal. The second input matching circuit may comprise a second inductor (e.g., inductor 412 in FIG. 5A) coupled between an input and an output of the second input matching circuit. The second input matching circuit may also comprise other circuit components, e.g., one or more capacitors.

In an exemplary design, the apparatus may further include a cascode transistor (e.g., cascode transistor 436 in FIGS. 5A to 5D) coupled between the gain transistor and an amplifier output. The gain transistor may receive and amplify the input RF signal based on the variable gain. The cascode transistor may provide an output RF signal when it is enabled. The apparatus may further include a second cascode transistor, e.g., for a SIMO LNA. The second cascode transistor (e.g., cascode transistor 438 in FIG. 7A) may be coupled between the gain transistor and a second amplifier output. The second cascode transistor may provide a second output RF signal when it is enabled. In an exemplary design, the bias current of the gain transistor may be determined based on whether one or two output RF signals are provided by the cascode transistor and the second cascode transistor. The bias current of the gain transistor may also be determined based on other factors such as gain, etc.

In an exemplary design, the apparatus may further include a second gain transistor, a second inductor, a second input matching circuit, and third and fourth cascode transistors, e.g., for a MIMO LNA. The second gain transistor (e.g., gain transistor 464 in FIG. 8) may have a variable gain determined based on a bias current of the second gain transistor. The second inductor (e.g., inductor 462) may be coupled between the second gain transistor and circuit ground. The second input matching circuit (e.g., configurable input matching circuit 450) may be selectively coupled to the second gain transistor based on the variable gain of the second gain transistor. The third cascode transistor (e.g., cascode transistor 466) may be coupled between the second gain transistor and the amplifier output. The fourth cascode transistor (e.g., cascode transistor 468) may be coupled between the second gain transistor and the second amplifier output.

Figure 9:
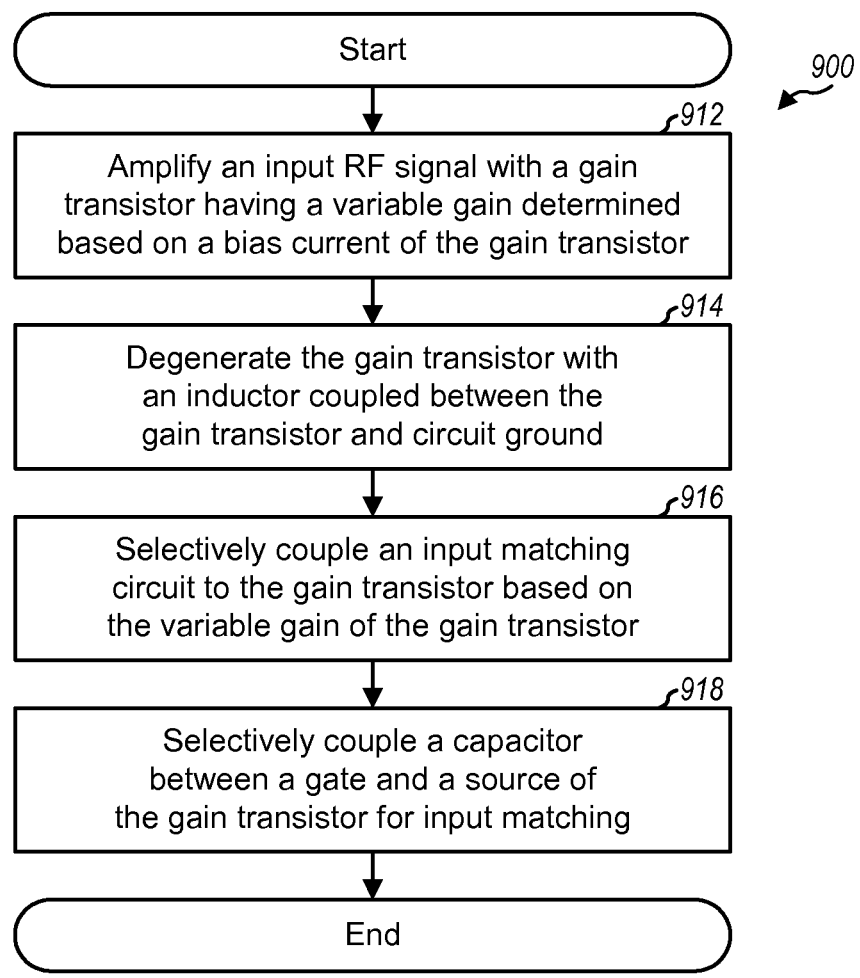
FIG. 9 shows a process for performing signal amplification.

FIG. 9 shows an exemplary design of a process 900 for performing signal amplification. An input RF signal may be amplified with a gain transistor (e.g., gain transistor 434 in FIG. 4) having a variable gain determined based on a bias current of the gain transistor (block 912). The gain transistor may be degenerated with an inductor (e.g., inductor 432 in FIG. 4) coupled between the gain transistor and circuit ground (block 914). The gain transistor and the inductor may be part of an amplifier, e.g., an LNA. An input matching circuit (e.g., configurable input matching circuit 420 in FIG. 4) may be selectively coupled to the gain transistor based on the variable gain of the gain transistor (block 916).

In an exemplary design of block 916, a resistor (e.g., resistor 526 in FIG. 5A) may be coupled between the gain transistor and circuit ground and may be used for input matching when the input matching circuit is coupled to the gain transistor. In an exemplary design, a capacitor (e.g., capacitor 524 in FIG. 5A) may be coupled in series with the resistor and may be pre-charged to a bias voltage when the input matching circuit is decoupled from the gain transistor. In an exemplary design, a second capacitor (e.g., capacitor 544 in FIG. 6) may be selectively coupled between a gate and a source of the gain transistor and may be used for input matching (block 918).

The amplifiers with inductive degeneration and configurable gain and input matching disclosed herein may be implemented on an IC, an analog IC, an RFIC, a mixed-signal IC, an ASIC, a printed circuit board (PCB), an electronic device, etc. The amplifiers may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an amplifier with inductive degeneration and configurable gain and input matching disclosed herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a gain transistor having a variable gain determined based on a bias current of the gain transistor;
   an inductor coupled between the gain transistor and circuit ground and configured to provide degeneration to the gain transistor; and
   an input matching circuit selectively coupled to the gain transistor based on the variable gain of the gain transistor;
   wherein the input matching circuit comprises a second transistor and a component that is one of a resistor and a capacitor, the component being configured to provide input matching of an amplifier comprising the gain transistor and the inductor when the input matching circuit is coupled to the gain transistor, and the second transistor is operable to couple the component to the gain transistor or decouple the component from the gain transistor.

2. The apparatus of claim 1, the input matching circuit being coupled to the gain transistor in a low-gain mode and decoupled from the gain transistor in a high-gain mode.

3. The apparatus of claim 1, wherein the component is a resistor, and the input matching circuit further comprises:
   a capacitor coupled in series with the resistor and the second transistor.

4. The apparatus of claim 3, the capacitor being coupled between a source of the second transistor and circuit ground, and the resistor being coupled between a drain of the second transistor and a gate of the gain transistor.

5. The apparatus of claim 3, the input matching circuit further comprising:
   a third transistor coupled between a bias voltage and the capacitor and operable to pre-charge the capacitor to the bias voltage when the input matching circuit is decoupled from the gain transistor.

6. The apparatus of claim 1, wherein the component is a capacitor having an adjustable capacitance.

7. The apparatus of claim 1, further comprising:
   a second input matching circuit coupled to a gate of the gain transistor.

8. The apparatus of claim 7, the second input matching circuit comprising a second inductor coupled between an input and an output of the second input matching circuit.

9. An apparatus comprising:
   a gain transistor having a variable gain determined based on a bias current of the gain transistor;
   an inductor coupled between the gain transistor and circuit ground and configured to provide degeneration to the gain transistor;
   an input matching circuit selectively coupled to the gain transistor based on the variable gain of the gain transistor; and
   a cascode transistor coupled between the gain transistor and an amplifier output, the gain transistor operable to receive and amplify an input radio frequency (RF) signal based on the variable gain, and the cascode transistor operable to provide an output RF signal.

10. The apparatus of claim 9, further comprising:
    a second cascode transistor coupled between the gain transistor and a second amplifier output and configurable to provide a second output RF signal.

11. The apparatus of claim 9, further comprising:
    a second gain transistor coupled to the gain transistor and having a second variable gain determined based on a second bias current of the second gain transistor;
    a second inductor coupled between the second gain transistor and circuit ground;
    a second cascode transistor coupled between the second gain transistor and the amplifier output; and
    a third cascode transistor coupled between the second gain transistor and a second amplifier output.

12. The apparatus of claim 10, further comprising:
    a second gain transistor having a variable gain determined based on a bias current of the second gain transistor;
    a second inductor coupled between the second gain transistor and circuit ground;
    a second input matching circuit selectively coupled to the second gain transistor based on the variable gain of the second gain transistor;
    a third cascode transistor coupled between the second gain transistor and the amplifier output; and
    a fourth cascode transistor coupled between the second gain transistor and the second amplifier output.

13. A method comprising:
    amplifying an input radio frequency (RF) signal with a gain transistor having a variable gain determined based on a bias current of the gain transistor;
    degenerating the gain transistor with an inductor coupled between the gain transistor and circuit ground; and
    selectively coupling an input matching circuit to the gain transistor based on the variable gain of the gain transistor by coupling a resistor between the gain transistor and circuit ground for input matching when the input matching circuit is coupled to the gain transistor.

14. The method of claim 13, further comprising:
    pre-charging a capacitor, coupled in series with the resistor, to a bias voltage when the input matching circuit is decoupled from the gain transistor.

15. A method comprising:
    amplifying an input radio frequency (RF) signal with a gain transistor having a variable gain determined based on a bias current of the gain transistor;
    degenerating the gain transistor with an inductor coupled between the gain transistor and circuit ground; and
    selectively coupling an input matching circuit to the gain transistor based on the variable gain of the gain transistor by selectively coupling a capacitor between a gate and a source of the gain transistor for input matching.

16. An apparatus comprising:
    means for amplifying an input radio frequency (RF) signal with a variable gain determined based on a bias current of the means for amplifying;

means for degenerating coupled between the means for amplifying and circuit ground; and means for input matching selectively coupled to the means for amplifying based on the variable gain of the means for amplifying, wherein the means for input matching comprises resistive means coupled between the means for amplifying and circuit ground and used for input matching when the means for input matching is coupled to the means for amplifying.

17. The apparatus of claim 16, further comprising:

capacitive means selectively coupled between nodes of the means for amplifying and used for input matching.

* * * * *